United States Patent
Castleman et al.

[11] Patent Number: 5,949,235
[45] Date of Patent: Sep. 7, 1999

[54] SYSTEM AND METHOD FOR DETECTION AND CONTROL OF UNGROUNDED PARTS IN A PRODUCTION COATING LINE

[75] Inventors: David A. Castleman, Claremont; Anthony B. Williams, La Habra; Chris A. Selstad, Fullerton, all of Calif.

[73] Assignee: Fire Sentry Corporation, Brea, Calif.

[21] Appl. No.: 08/493,639

[22] Filed: Jun. 22, 1995

[51] Int. Cl.⁶ .................................................. G01R 27/26
[52] U.S. Cl. ......................... 324/509; 324/456; 239/708; 361/228
[58] Field of Search .................................. 324/509, 455, 324/456; 239/708, 18; 361/228; 363/59

[56] References Cited

U.S. PATENT DOCUMENTS

| | | |
|---|---|---|
| Re. 28,394 | 4/1975 | Point . |
| 3,739,228 | 6/1973 | Point . |
| 3,787,707 | 1/1974 | Gregg . |
| 4,718,497 | 1/1988 | Moore et al. . |
| 5,278,512 | 1/1994 | Goldstein ................................. 324/509 |
| 5,311,167 | 5/1994 | Plimpton et al. . |
| 5,339,070 | 8/1994 | Yalowitz et al. . |
| 5,598,099 | 1/1997 | Castleman ................................. 324/456 |
| 5,626,236 | 5/1997 | Hiebert ..................................... 209/538 |
| 5,644,223 | 7/1997 | Verkuil ................................... 324/158.1 |

Primary Examiner—Maura Regan
Attorney, Agent, or Firm—Lyon & Lyon LLP

[57] ABSTRACT

A system and method for detecting and controlling ungrounded parts during the electrostatic coating process in order to improve production flow, provide an overall cost saving by efficient use of the coating material and prevention of accidental fires and false shutdown during production. The system of the present invention comprises a detection system for detecting any ungrounded parts prior to entering a coating environment, such as a painting booth. The detection system in accordance with one embodiment, comprises an array of detectors, specifically, an ultraviolet sensor, a radio-frequency wave sensor, an acoustic sensor and a light sensor, which upon sensing specific characteristics generate representative signal waveforms. These waveforms are than compared with stored waveforms relating to profiles of sparking or corona discharge characteristics. Correlation circuits may correlate data obtained by two or more sensors in order to ensure that the spark or corona discharge is caused by an ungrounded part. In accordance with an alternative embodiment, the detection system comprises a measuring device, such as a sensitive electric field meter, for measuring the electrical potential field between each part to be coated and ground.

24 Claims, 3 Drawing Sheets

SYSTEM AND METHOD FOR DETECTION AND CONTROL OF UNGROUNDED PARTS IN A PRODUCTION COATING LINE

FIELD OF THE INVENTION

This invention relates generally to the field of electrostatic coating of parts in a production line, for example, electrostatic painting (liquid and powder). More specifically, this invention relates to the field of detecting and controlling ungrounded parts during the electrostatic coating process in order to improve production flow, provide an overall cost savings by facilitating efficient use of the coating material, and prevent accidental fires and undesirable hindrances during production, for example, false shutdown.

BACKGROUND OF THE INVENTION

For many years, electrostatic coating or spraying has been a widely accepted technique for large scale application of paint, as for example in a production painting line. Typically, spraying involves the movement of very small droplets of "liquid" paint or particles of "powdered" paint from a nozzle to the surface of a part to be coated. The droplet or particle size may vary from less than 0.001 inches (0.025 mm) to greater than 0.1 inches (2.54 mm) depending on the paint viscosity and the air pressure. When the droplets fall on the surface of the part, they flow together to form a continuous wet coat.

Most industrial operations use conventional air spray systems in which compressed air is supplied to a spray gun and to a paint container. At the gun, the compressed air mixes, somewhat violently, with the paint, causing it to break up into small droplets, which are propelled toward the surface of the part to be coated. The process of breaking up the paint into droplets is referred to as "atomization."

Electrostatic spraying involves the movement of electrically charged paint droplets along lines of force that exist between an electrically charged spray gun and a grounded part. Because the paint follows electrical lines of force, it has less of a tendency to miss the part, thus reducing overspray. The paint generally "wraps around" to the rear surface of the part.

Atomization of the paint may be achieved by well-known air, airless or rotational techniques. Air and airless electrostatic guns generally utilize an external ionizing electrode to ionize or charge the air surrounding the part to be coated. Alternatively, electrostatic guns also utilize a metal electrode located within the interior or at the paint container to charge the liquid paint before it is atomized. Rotational methods utilize a rotating electrically charged disk, bell or cone to break up the paint. Atomization is achieved by a combination of centrifugal and electrostatic force.

There are many advantages to electrically coating parts in a production line. For example, electrostatically applied paint is often uniform in thickness, for the simple reason that the charged paint seeks the thinnest part of the wet film so it can better render its charge and adhere to the surface of the part. Smooth application on the edges of a part results from the wrap-around effect of the electrical field. In addition, electrostatic coating of parts in a production paint line facilitates efficiency.

In spite of the many production advantages, there exist safety concerns such as possibilities for electrical shock and fire hazards. A shock may be experienced if a person contacts any part of the coating system not protected by a current limiting circuit. The fire hazard is generally more severe. Sparks generally occur during the electrostatic coating operation. During electrostatic coating it is common to operate a device for dispersing and charging the coating material at a potential of 40,000 volts or higher. In instances, where the coating material is a paint having a volatile solvent, the danger of an explosion or fire from sparking is in fact quite serious.

Fires are also a possibility if electrical arcs occur between charged objects and a grounded conductor in the vicinity of flammable vapors. In any ungrounded metal object which acquires a charge because of its proximity to the gun, if the charge builds to a high enough level, an arc may appear. The usual way to prevent the discharge-arc-fire problem is to ground every object in the paint booth.

For example, in a conventional coating system, parts to be coated are generally transported through a coating zone by a mechanical conveyor. The conveyor is operated at ground potential and the parts are supported on the conveyor by hooks or supports of conductive material to also maintain the parts at ground potential. The coating device includes an electrically charged electrode, preferably at a negative potential with respect to ground. A bad contact between the metallic part to be coated and the conveyor, which can result form a conveyor hook being partly covered with paint or powder during previous passages through the coating zone, can exist. In general, conveyor hooks are not sufficiently cleaned after passing through the coating zone, so that after a number of successive passages, they are covered with a crust which is sufficiently insulating to prevent electric contact between the metallic part to be coated and the grounded conveyor. In consequence, the part to be coated, as it passes close to the electrodes under high tension, acquires electric charges which accumulate on the part until it develops a potential sufficiently high to cause the breakdown of the insulating crust between the part and the hook. This poses a two-fold problem. First, the breakdown is accompanied by a spark capable of developing sufficient energy to ignite the surrounding mixture of air and finely divided coating product. In addition, many of the benefits associated with electrostatic coating are lost if the articles are not properly grounded to terminate the electrostatic field.

To maintain the efficiency of the electrostatic coating process, the spray head and the supporting surfaces must be frequently cleaned. If these surfaces become coated with a layer of dirt or grime, the electrical charge may eventually leak through this layer and be grounded. This typically reduces the charging efficiency of the spray gun as well as decreases attraction to the spray gun. Moreover, the wrap-around effect is reduced and overspray is increased. Frequent cleaning, although necessary, is undesirable in view of the manual labor it involves, which hinders the automated process.

U.S. Pat. No. Re. 28,394 to Point proposes an apparatus for testing electrical contact between metallic objects. However, the apparatus proposed in that patent merely detects sparks with the intention of preventing fires. In addition, U.S. Pat. No. 3,787,707 to Gregg also proposes a spark detector apparatus and method to distinguish disruptive charges in the electrostatic system from a corona discharge or random sparking of other electrical equipment by detecting the presence of repetitive charges.

Thus, a system and method for detecting and controlling ungrounded parts in a production line is desirable.

SUMMARY OF THE INVENTION

The present invention is directed to a system and method for detecting and controlling ungrounded parts during the electrostatic coating process in order to improve production flow, provide an overall cost savings by facilitating efficient use of the coating material, and prevent accidental fires and undesirable hindrances during production, for example, false shutdown.

The system of the present invention comprises a detection system for detecting any ungrounded parts prior to those parts entering the coating zone, such as a painting booth. The detection system in accordance with one embodiment, utilizes one or more detection techniques, namely, utilizing ultraviolet light, radio-frequency electromagnetic waves, acoustic waves and/or light for detecting sparking and/or corona discharge. In accordance with a preferred embodiment the detection system employs a "correlation technique" for detecting ungrounded parts, which utilizes two or more detection techniques to confirm the existence of an ungrounded part. Upon detecting an ungrounded part, the part may be removed from the production line and steps to properly ground it may be taken, for example, the hook maybe cleaned or the like. The correlation of two detection methodologies thus prevents false shutdowns in the production line.

The detection system may comprise an array of detectors, specifically an ultraviolet sensor, a radio-frequency wave sensor, an acoustic sensor and a light sensor, which generate representative signal waveforms when they sense specific characteristics of an ungrounded part. These waveforms are then compared with stored waveforms relating to profiles of sparking or corona discharge characteristics by a control circuit, such as a microprocessor. Correlation circuits may correlate data obtained by two or more sensing techniques in order to confirm that the spark of corona discharge is caused by an ungrounded part. Upon sensing an actual ungrounded part, select circuits are activated to actuate an appropriate one of several functions, such as an alert, a system fault and the like, connected in parallel.

In accordance with an alternative embodiment of the present invention, the detection system comprises a measuring device, such as a sensitive electric field meter, for measuring the electrical potential field between the part and ground.

These as well as other features of the invention will be apparent to one skilled in the art from the following detailed description of some specific embodiments thereof.

BRIEF DESCRIPTION OF THE DRAWING FIGURES

Further features and advantages of the invention will become readily apparent from the following specification and from the drawings, in which.

DETAILED DESCRIPTION OF SOME PREFERRED EMBODIMENTS

Figure 1:
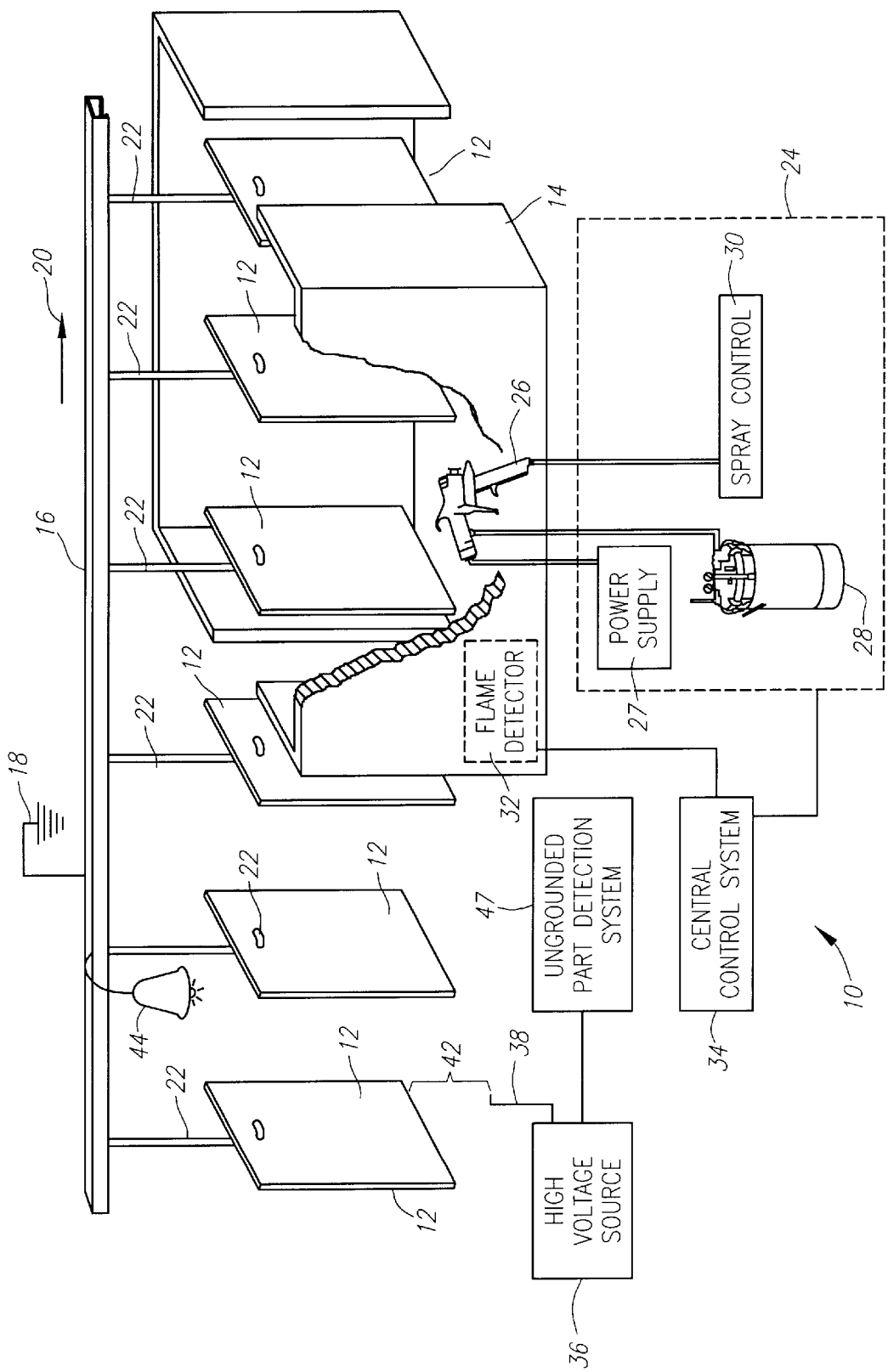
FIG. 1 is a diagrammatic illustration of an electrostatic coating system and process in accordance with the present invention, in which parts are moved by a conveyor through a coating zone after a detection system checks for ungrounded parts in the production paint line.

FIG. 1 illustrates an exemplary system 10 in accordance with the present invention for detecting and controlling the presence of any ungrounded parts or articles prior to electrostatic coating of the parts in a production coating line, for example an electrostatic painting (liquid or powder) line. With reference to FIG. 1, preliminarily the general environment with the respect to electrostatic coating along with some aspects of the operation is described.

As illustrated in FIG. 1, parts 12 are transported through a coating zone, such as a painting booth or enclosure 14, by a conveyor 16 connected to a reference potential or ground indicated at 18. The direction in which the conveyor moves is indicated by an arrow referenced as 20. The parts 12, are typically supported from the conveyor by a conductive hook-like support or hanger 22.

The electrostatic coating system illustrated in FIG. 1 represents an air electrostatic spray system of a type used in many industrial operations. A typical industrial spray system indicated at 24 includes a spray gun 26 coupled to a power supply 27, a paint supply container 28 (for example, a pressure tank) and some form of spray control mechanism indicated by block 30. The spray control mechanism 30 may include an air compressor and an air regulator (not separately shown). Conventional air spray guns may be of the pressure or suction feed type. Pressure-feed guns are usually used where large volumes of paint must be applied rapidly. Such air spray guns use paint supplied by air or mechanical pressure. Suction-feed guns are used where a number of colors are required on an intermittent basis for low volume production, such as in automobile refinishing. The paint is supplied from a cup connected directly to the spray gun by creating a vacuum over the paint and allowing it to rise to the air cap of the gun through a feed tube which extends down into the paint cup. The vacuum occurs when compressed air from the air cup rushes over the gun orifice and aspirates air from within the feed tube. The paint flows from within the cup to replace the aspirated air and is atomized by the pressurized air at the gun tip. Air, pressure-feed spray guns are well known and used in many industrial operations.

The air spray gun 26 is mounted at a predetermined distance from the facing surface of the part 12. The distance affects both the film thickness and appearance. Spray gun manufacturers generally recommend that the spray gun 26 should be mounted at a distance of about 12 inches. Many automatic spray set-ups move the spray head away from and toward the part 12, in the event its shape changes so that a constant distance is maintained.

The paint supply container 28 generally holds the paint under an air pressure sufficiently high to force the paint to the spray gun 26 at a desired rate. Delivery rates of 420–720 ml per minute are typical and the size of such containers vary depending on applications. For example, a single container may supply several spray guns. For larger operations, paint is often supplied from drums with a capacity of 55 or more gallons. Some large industrial installations may circulate pressurized paint from a central mix room to ten or more spray booths. When drums or large tanks are used, the paint may be supplied by air or hydraulically driven pumps rather than by direct air pressure. Thus, the system illustrated in FIG. 1 is intended to represent any one or more of the above described situations.

An exemplary spray control mechanism 30 may comprise a conventional air compressor and air regulator. In a conventional air compressor, an electrically driven piston usually keeps the pressure in an air tank within a pre-set range. Air from this tank is supplied to the paint tank 28 and the spray gun 26. The air regulator (shown as part of the spray control block) allows air at different pressures to be supplied to the paint container and the spray gun. The regulator often includes a filter to trap air and water which may be present in the line.

Alternatively, airless spraying techniques may also be used. Unlike air spray systems, airless guns use no air at all. Paint is supplied to the gun at very high pressures, typically 1000–4000 psi. When the pressurized paint enters the much lower pressure region in front of the spray gun, the sudden drop in pressure causes the paint to be atomized. This process is similar to water being emitted from a garden hose.

The spraying booth 14 is an enclosure around the painting area configured to keep paint within the paint area and the dirt out of the wet paint. Spray booths 14 may be of the downdraft or sidedraft variety typically used in most industrial operations. Downdraft booths are generally used for large parts to facilitate painting from two sides to avoid the need for turning the parts. Sidedraft booths are generally used for smaller parts sprayed from one side only. Most spray booths have a volume of water which traps the excess (overspray) paint. Chemicals in the water coagulate the paint. However, some production paint booths are operated dry, that is, with disposable filters rather than water to trap excess paint.

Spraying booths may have flame detectors 32 disposed at appropriate locations to provide an indication of fire to a central control system indicated at 34.

Figure 2:
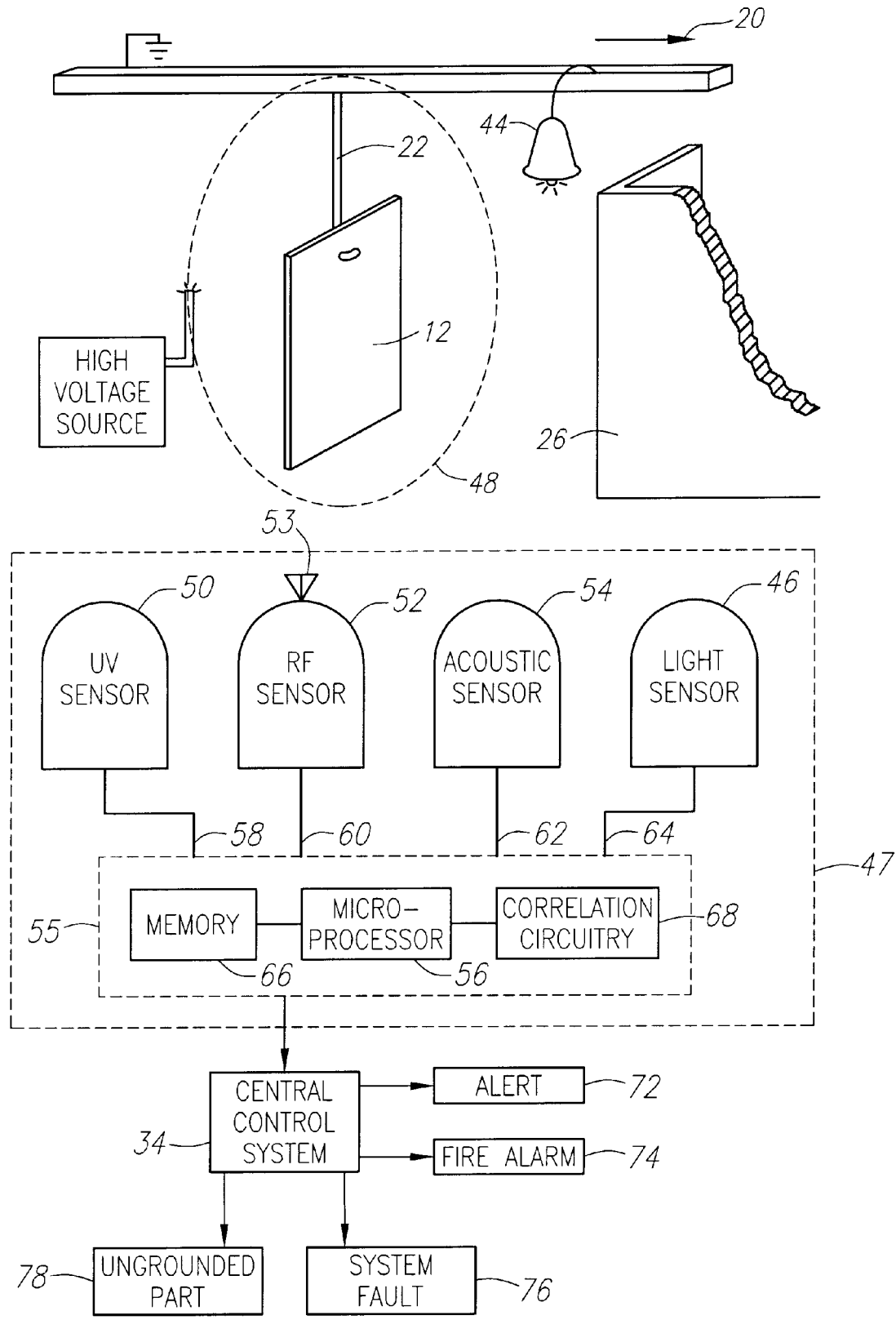
FIG. 2 is a block diagram of one embodiment of the detection system of FIG. 1 wherein sparking or corona discharge induced by a high voltage is observed.

Prior to entering the spray booth 14, the parts 12 to be coated are tested to assure that they are adequately grounded. The parts 12 are passed proximate a high voltage source 36 with a high voltage antenna 38. The high voltage source 36 may be one available from Nordson as Model number EPU-9. Electrical charge is transferred from the high voltage source, which may operate between 60,000–120,000 volts, to the parts 12 to be coated, through a resistive air gap (shown more clearly in FIGS. 3 and 4), indicated at 42. A light source 44 may be mounted on the conveyor 16 or at any other appropriate location and utilized in conjunction with a light sensor 46 (FIG. 2) within an ungrounded part detection system 47 to sense a part 12 as it travels through the high voltage field indicated in dashed lines and referenced as 48 (FIG. 2). The detection system 47 may be located at a fixed position proximate the conveyor 16 or, alternatively, the detection system 47 may be moved or scanned over the production line of parts 12. The parts 12 within the painting booth 14 are distinguished with shading lines to indicate painted surfaces.

Referring now to FIG. 2, in accordance with one embodiment of the present invention, the detection system 47 may comprise an array of detectors or sensors utilizing one or more detection techniques well known for detection of fire. The detection system 47 may comprise a UV (ultraviolet) sensor 50 for sensing ultraviolet light, a RF (radio-frequency) sensor 52 for sensing radio-frequency electromagnetic waves and an acoustic sensor 54 for sensing acoustic waves for detecting sparking and/or corona discharge.

Each of the sensors within the detection system 47 generate representative signal waveforms when they sense specific characteristics of an ungrounded part, such as sparking or corona discharge. The UV sensor 50 utilizes well known techniques for sensing ultra-violet wavelength radiation. The UV sensor 50 is responsive to UV radiation within a spectral band selected to include UV radiation typically emitted with sparking and exclude spurious radiation from arc-welding, solar energy lighting or the like, and generates a signal representative of the sensed radiation. The RF sensor 52 utilizes well-know techniques for sensing radio-frequency electromagnetic waves and generates a representative signal. The RF sensor 52 requires only a single antenna 53 as shown in FIG. 2. The acoustic sensor 54 likewise utilizes well-known techniques of sensing acoustic waves and generates a representative signal.

The output signals from the sensors 50, 52, 54 and 46, respectively, are digitally processed and fed to a control circuit 55, which may comprise a microprocessor 56. The output signals are indicated by lead lines 58, 60, 62 and 64, respectively. The microprocessor 56 may be any suitable microprocessor known to those skilled in the art. The representative signal waveforms received from the UV sensor 50, the RF sensor 52 and the acoustic sensor 54 are then compared with stored waveforms associated with profiles of sparking or corona discharge characteristics. The waveforms associated with typical profiles of sparking or corona discharge characteristics are stored in a memory 66 of the control circuit 55.

Figure 4:
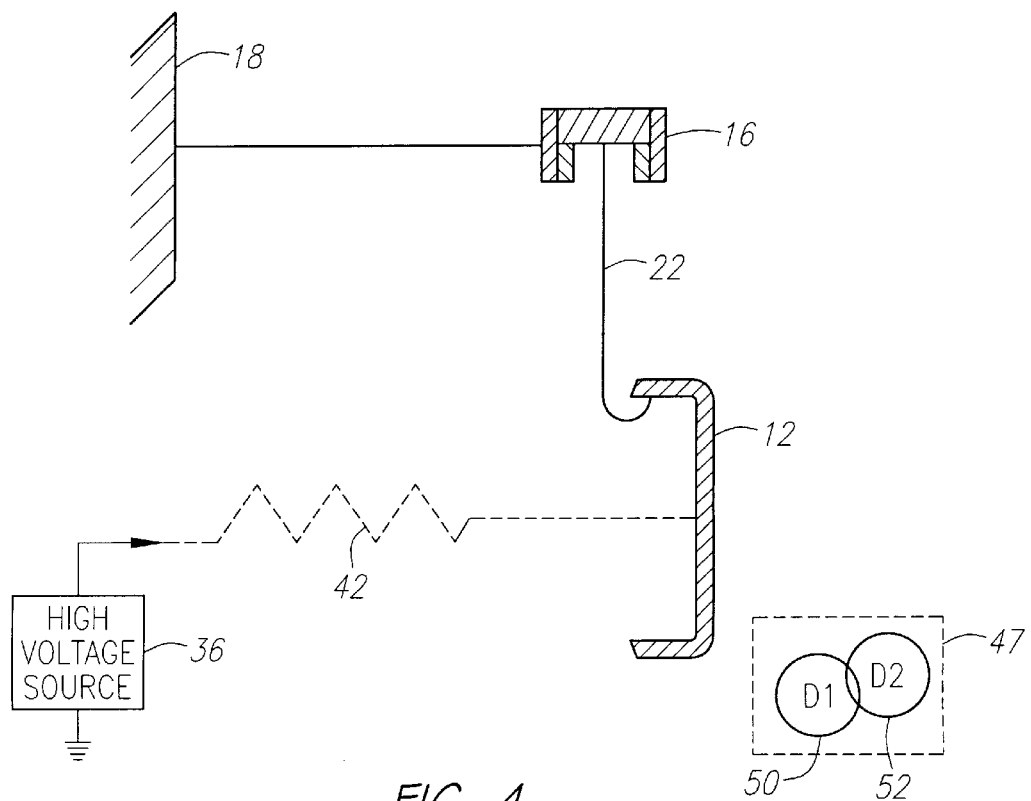
FIG. 4 is a diagrammatic illustration of the embodiment of FIG. 2 showing the correlation technique.

Referring now to FIGS. 2 and 4, in accordance with a preferred embodiment of the present invention, the control circuit 55 comprises correlation circuitry 68 (FIG. 2) to correlate data obtained by at least two of the sensing techniques in order to confirm that a spark or corona discharge is caused by an ungrounded part 12 under test, rather than by an external source, such as lightning. FIG. 4 illustrates an exemplary situation where sensed data from the UV sensor 50 (also indicated as D1) and the RF sensor 52 (also indicated as D2) is used to confirm that an observed spark or corona discharge results from a part 12 under test, rather than other UV or RF sources. Of course, sensed data from any combination of the three sensors 50, 52 and 54 may be used to confirm that an observed spark is from the part 12 under test.

If a spark or corona discharge is detected, the test should be repeated in the event the spark or corona discharge has burned through the insulating crust between the part 12 and the hook 22. In such cases performing the initial test or check serves to ground a part 12. Accordingly, repeating the test confirms that the particular part 12 is grounded, which prevents a premature and false indication that temporary shutdown of the production line is required.

Upon confirmation that the spark or corona discharge is caused by an ungrounded part, information data is relayed to the central control system 34 as indicated by data bus 70. Select circuits (shown as part of the central control system) within the central control system 34 associated with select functions, such as an alert 72, a fire alarm 74, a system fault indicator 76, an ungrounded part indicator 78 and the like may be selectively activated to actuate an appropriate one of the select functions. For example, when a part is found to be ungrounded, the central control system 34 may actuate the ungrounded part indicator 78 or the alert 72 or both. Likewise, when flame is detected by the flame detector 32 (FIG. 1), the central control system 34 may actuate the fire alarm 74. Upon detecting some system fault or error, the central control system may actuate the system fault indicator 76 to cause a shutdown of the production line.

Figure 3:
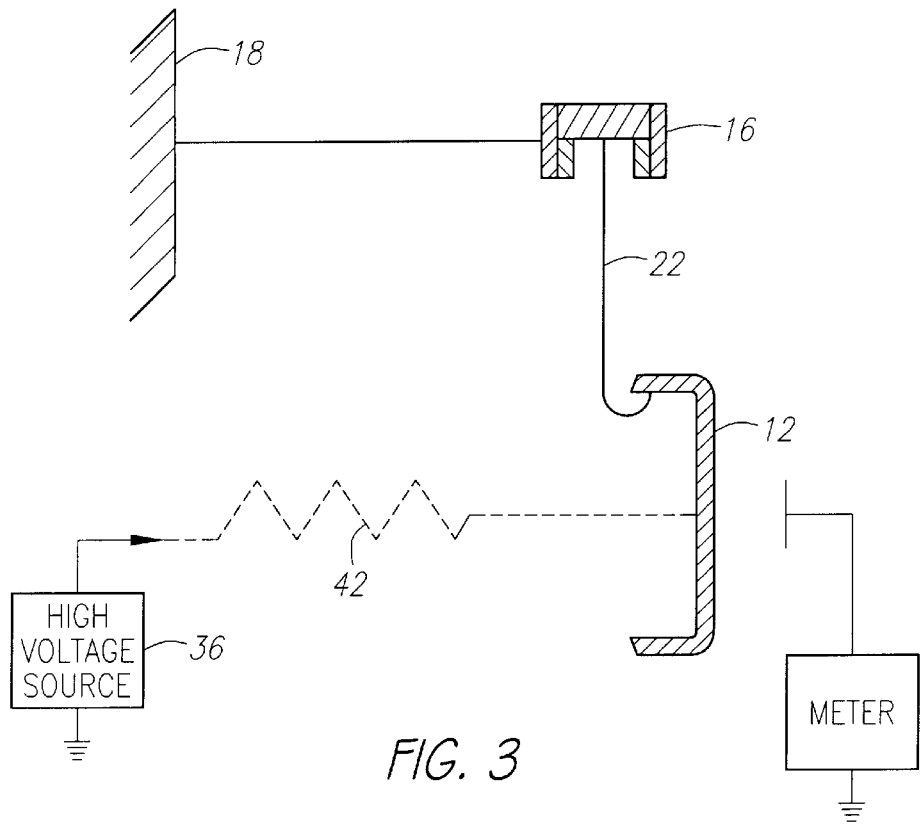
FIG. 3 is a diagrammatic illustration of another embodiment of the detection system wherein the dissipation of charge induced within an exemplary part is measured.

Referring now to FIG. 3, in accordance with an alternative embodiment, an ungrounded part is detected by inducing a charge in a part 12 under test using direct current (DC) and measuring the electrical field around the charged part 12. In accordance with this embodiment, the high voltage source 36 (supplying between 60,000–120,000 Volts DC) is disposed proximate the conveyor 16, such that the line of parts 12 travel anywhere within 3 inches and 10 feet from the high voltage source 36. In an exemplary embodiment, the high voltage source 36 is positioned such that the line of parts 12 pass between 3 to 6 inches from the high voltage source 36. The high voltage source 36 is then turned off and the electrical potential field between the part 12 and ground is measured by using a sensitive electric field meter 80, for example an electrostatic meter Model ESM 5000, manufactured by Davis Instruments. If the parts 12 under test are properly connected to ground, the induced charge will drain off. Accordingly, the meter 80 provides no indication of an electrical field. However, if the parts 12 under test are ungrounded or inadequately grounded, the parts 12 retain a charge above a certain threshold, which when detected by the meter 80 provides an accurate indication of the status of that part 12.

While the invention has been described in conjunction with specific embodiments thereof, many alternatives, modifications and variations will be apparent to those skilled in the art in view of the foregoing description. Accordingly, it is intended to embrace all such alternatives, modifications and variations which fall within the spirit and scope of the appended claims.

What is claimed is:

1. A system for detecting and controlling ungrounded or inadequately grounded parts prior to subjecting said parts to an electrostatic coating process, comprising:
    a source for imparting an electrical charge to said parts under test;
    a detection system for sensing specific characteristics of ungrounded or inadequately grounded parts under test, such as sparking or corona discharge characteristics, and generating waveforms representative of said specific characteristic by utilizing a plurality of distinct sensing techniques;
    a memory coupled to said detection system for storing waveforms representative of profiles of sparking or corona discharge characteristics; and
    a control circuit coupled to said detection system and said memory for receiving said waveforms generated by said detection system and comparing said waveforms with said waveforms stored in said memory and providing output signals, said control circuit comprising correlation circuits to correlate output signals obtained by at least two of said two distinct sensing techniques to confirm existence of an ungrounded or poorly grounded part.

2. A system for detecting and controlling ungrounded or inadequately grounded parts according to claim 1, wherein said detection system comprises an ultraviolet sensor for sensing ultraviolet radiation within a predetermined spectral band and generating a signal representative of the sensed radiation.

3. A system for detecting and controlling ungrounded or inadequately grounded parts according to claim 1, wherein said detection system comprises a RF sensor for sensing radio-frequency magnetic waves and generating a representative sensed signal.

4. A system for detecting and controlling ungrounded parts or inadequately grounded parts according to claim 1, wherein said detection system comprises an acoustic sensor for sensing acoustic waves and for generating a representative sensed signal.

5. A system for detecting and controlling ungrounded parts or inadequately grounded parts according to claim 1, further comprising:
    a light source for emitting light; and
    a light sensor oriented relative to said light source to detect when said parts pass said light source.

6. A system for detecting and controlling ungrounded parts or inadequately grounded parts according to claim 1, further comprising:
    a plurality of function indicators coupled to said control circuit and selectively actuated by said control circuit to indicate a specific one of a plurality of conditions.

7. A system for detecting and controlling ungrounded or inadequately grounded parts prior to subjecting said parts to an electrostatic coating process, comprising:
    a source for imparting an electrical charge to said parts under test; and
    a detector for measuring the electrical field between a specific part under test and ground to determine if a measured value for said part under test is greater than a predetermined threshold generally indicative of an ungrounded or inadequately grounded part.

8. A process for detecting and controlling ungrounded or inadequately grounded parts prior to subjecting said parts to an electrostatic coating process, comprising the steps of:
    imparting an electrical charge to said parts under test;
    sensing specific characteristics of ungrounded or inadequately grounded parts under test, such as sparking or corona discharge characteristics;
    generating waveforms representative of said specific characteristic by utilizing a plurality of distinct sensing techniques;
    storing waveforms representative of profiles of sparking or corona discharge characteristics;
    receiving said waveforms generated by said detection system and comparing said waveforms with said stored waveforms to provide output signals;
    correlating output signals obtained by at least two distinct sensing techniques to confirm existence of an ungrounded or poorly grounded part.

9. A process for detecting and controlling ungrounded or inadequately grounded parts according to claim 8, wherein said sensing step further comprises the step of:
    sensing ultraviolet radiation within a predetermined spectral band and generating a signal representative of the sensed radiation.

10. A process for detecting and controlling ungrounded or inadequately grounded parts according to claim 8, wherein said sensing step further comprises the step of:
    sensing radio-frequency magnetic waves and generating a representative sensed signal.

11. A process for detecting and controlling ungrounded parts or inadequately grounded parts according to claim 8, wherein said sensing step further comprises the step of:
    sensing acoustic waves and for generating a representative sensed signal.

12. A process for detecting and controlling ungrounded parts or inadequately grounded parts according to claim 8, further comprising the steps of:
    emitting light from a light source located over said parts under test; and
    orienting a light sensor relative to said light source to detect when said parts pass said light source.

13. A process for detecting and controlling ungrounded parts or inadequately grounded parts according to claim 8, further comprising the step of:
    selectively actuating one of a plurality of function indicators indicative of a specific one of a plurality of conditions.

14. A process for detecting and controlling ungrounded or inadequately grounded parts prior to subjecting said parts to an electrostatic coating process, comprising the steps of:

imparting an electrical charge to said parts under test; and measuring the electrical field between a specific part under test and ground to determine if a measured value for said part under test is greater than a predetermined threshold generally indicative of an ungrounded or inadequately grounded part.

15. A process for detecting and controlling ungrounded or inadequately grounded parts in a production line of parts for electrostatic coating, comprising the steps of:

imparting an electrical charge to said parts in said production line prior to subjecting said parts to an electrostatic coating process;

performing an initial test on each of said parts in said production line to identify ungrounded or inadequately grounded parts by sensing specific characteristics of each of said parts; and repeating said test on each part subsequent to said initial test in the event imparting said electrical charge during said initial test successfully grounded a previously ungrounded part to avoid an undesirable shutdown of said production line.

16. A system for detecting and controlling ungrounded or inadequately grounded parts in a production process, comprising:

a source for imparting an electrical charge to the parts;

a detector for using a plurality of distinct sensing methodologies to sense specific characteristics of ungrounded or inadequately grounded parts and for generating digital representations of waveforms representing the sensed characteristics;

a memory coupled to said detector for storing digital representations of waveforms representing predetermined profiles of characteristics of ungrounded or inadequately grounded parts; and a microprocessor coupled to said detector and said memory for receiving the digital representations of waveforms generated by said detector and for digitally comparing the received digital representations of waveforms with the digital representations of waveforms stored in said memory and for providing output signals in response to the comparison, said microprocessor comprising a plurality of correlation circuits for correlating output signals representing at least two distinct sensing methodologies to correctly confirm existence of an ungrounded or inadequately grounded part.

17. The system of claim 16, wherein said detector comprises an ultraviolet radiation sensor for sensing ultraviolet radiation within a predetermined spectral band and generating a signal representing the sensed radiation, and wherein one of the at least two distinct sensing methodologies comprises ultraviolet radiation sensing.

18. The system of claim 16, further comprising a plurality of function indicators coupled to said microprocessor and selectively actuated by said microprocessor to indicate a specific one of a plurality of conditions.

19. The system of claim 16, further comprising an alarm coupled to said microprocessor for providing a warning in response to a confirmed detection of an ungrounded or inadequately grounded part.

20. In an electrostatic paint spray coating conveyor apparatus, a system for detecting and controlling ungrounded or inadequately grounded parts, comprising:

a source for imparting an electrical charge to the parts;

a detector for using a plurality of distinct sensing methodologies to sense specific characteristics of ungrounded or inadequately grounded parts and for generating digital representations of waveforms representing the sensed characteristics;

a memory coupled to said detector for storing digital representations of waveforms representing predetermined profiles of characteristics of ungrounded or inadequately grounded parts; and a microprocessor coupled to said detector and said memory for receiving the digital representations of waveforms generated by said detector and for digitally comparing the received digital representations of waveforms with the digital representations of waveforms stored in said memory and for providing output signals in response to the comparison, said microprocessor comprising a plurality of correlation circuits for correlating output signals representing at least two distinct sensing methodologies to correctly confirm existence of an ungrounded or inadequately grounded part.

21. The system of claim 20, wherein said detector comprises an ultraviolet radiation sensor for sensing ultraviolet radiation within a predetermined spectral band and generating a signal representing the sensed radiation, and wherein one of the at least two distinct sensing methodologies comprises ultraviolet radiation sensing.

22. The system of claim 20, further comprising a plurality of function indicators coupled to said microprocessor and selectively actuated by said microprocessor to indicate a specific one of a plurality of conditions.

23. The system of claim 20, further comprising an alarm coupled to said microprocessor for providing a warning in response to a confirmed detection of an ungrounded or inadequately grounded part.

24. The system of claim 20, further comprising a light source and a light sensor oriented relative to said light source so as to detect when the parts move past said light source.

* * * * *